US006972607B1

(12) United States Patent
Chen et al.

(10) Patent No.: US 6,972,607 B1
(45) Date of Patent: Dec. 6, 2005

(54) CLOCK SIGNAL REGENERATION CIRCUITRY

(75) Inventors: Jinhua Chen, Shrewsbury, MA (US); Marlon Ramroopsingh, Attleboro, MA (US)

(73) Assignee: EMC Corporation, Hopkinton, MA (US)

( * ) Notice: Subject to any disclaimer, the term of this patent is extended or adjusted under 35 U.S.C. 154(b) by 36 days.

(21) Appl. No.: 10/728,262

(22) Filed: Dec. 4, 2003

(51) Int. Cl.[7] .................................................. G06F 1/04
(52) U.S. Cl. ....................................... 327/291; 327/294
(58) Field of Search ................................ 327/291, 292, 327/294, 298, 299, 530, 319; 375/316; 713/400; 330/261

(56) References Cited

U.S. PATENT DOCUMENTS

| | | | | |
|---|---|---|---|---|
| 4,591,801 | A * | 5/1986 | Yamaguchi et al. | 330/261 |
| 5,864,254 | A * | 1/1999 | Tashiro | 327/319 |
| 6,640,309 | B2 * | 10/2003 | Doblar et al. | 713/400 |
| 6,690,226 | B2 * | 2/2004 | Takai | 327/530 |
| 6,747,904 | B2 * | 6/2004 | Chen | 365/189.09 |
| 2004/0086061 | A1 * | 5/2004 | Lundberg | 375/316 |

* cited by examiner

*Primary Examiner*—Linh My Nguyen

(57) ABSTRACT

A method and circuit for regenerating clock signals. The method and circuit convert clock signals having either single- ended clock pulses or differential clock pulses into clock signals having substantially the same voltage swing. In one embodiment, the single-ended clock pulses are provided by a TTL logic circuit and the differential clock pulses are produced by a PECL logic circuit.

14 Claims, 8 Drawing Sheets

TTL output high

CLOCK SIGNAL REGENERATION CIRCUITRY

TECHNICAL FIELD

This invention relates to clock signal regeneration circuitry and more particularly to a common clock signal regeneration circuit adapted for use with either a single ended clock signal source or a differential clock signal source.

BACKGROUND

As is known in the art, it is sometimes required to regenerate clock signals at various points in a system. One such system is a data storage system wherein a host computer stores and reads data from a bank of disk drives through a system interface.

More particularly, large host computers and servers (collectively referred to herein as "host computer/servers") require large capacity data storage systems. These large computer/servers generally includes data processors, which perform many operations on data introduced to the host computer/server through peripherals including the data storage system. The results of these operations are output to peripherals, including the storage system.

One type of data storage system is a magnetic disk storage system. Here a bank of disk drives and the host computer/server are coupled together through an interface. The interface includes "front end" or host computer/server controllers (or directors) and "back-end" or disk controllers (or directors). The interface operates the controllers (or directors) in such a way that they are transparent to the host computer/server. That is, data is stored in, and retrieved from, the bank of disk drives in such a way that the host computer/server merely thinks it is operating with its own local disk drive. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

As described in such U.S. Patent, the interface may also include, in addition to the host computer/server controllers (or directors) and disk controllers (or directors), addressable cache memories. The cache memory is a semiconductor memory and is provided to rapidly store data from the host computer/server before storage in the disk drives, and, on the other hand, store data from the disk drives prior to being sent to the host computer/server. The cache memory being a semiconductor memory, as distinguished from a magnetic memory as in the case of the disk drives, is much faster than the disk drives in reading and writing data.

The host computer/server controllers, disk controllers and cache memory are interconnected through a backplane printed circuit board. More particularly, as described in U.S. Pat. No. 6,289,401, issued Sep. 11, 2001 and assigned to the same assignee as the present invention, the entire subject matter thereof being incorporated herein by reference, disk controllers are mounted on disk controller printed circuit boards and data therein passes to the backplane and then to the disk drive through an adapter board. Likewise, the host computer/server controllers are mounted on host computer/server controller printed circuit boards and data therein passes to the backplane and then to the host computer/server through an adapter board.

As s also known in the art, each one of the directors includes a clock for producing clock signals associated with data being processed by such director. In some applications, it may be describable to regenerate these clock signals for data passing through the adapter boards. However, some director boards may operate with GigE type signals and therefore use a clock which produces single- ended clock pulses such as are generated with TTL (transistor-transistor logic) logic circuitry. In some applications it may be desirable to have the directors operate with fiber channel, Ficon or Escon type signals. Therefore, it is necessary to replace the TTL single-ended clock used on directors with a differential clock, such as are generated with PECL (i.e., positive emitter coupled logic) logic circuitry. However, it would be desirable if the adapted board clock regeneration circuitry not require changing to accommodate this change in director board clock circuitry.

SUMMARY

In accordance with the present invention a method is provided for regenerating clock signals. The method includes converting clock signals having either single-ended clock pulses or differential clock pulses into clock signals having substantially the same voltage swing.

In one embodiment, the single-ended clock pulses are provided by a TTL logic circuit and the differential clock pulses are produced by an ECL logic circuit. In one embodiment, the ECL logic circuit is a PECL logic circuit.

In accordance with another feature of the invention, a method is provided for regenerating clock signals. The method includes providing a source of clock signals, such source producing either single- ended clock pulses or differential clock pulses. The clock signals are fed to a regeneration circuit. The regeneration circuit converts such clock signals having either the single- ended clock pulses or the differential clock pulses into clock signals having substantially the same voltage swing.

In accordance with another feature of the invention, a clock regeneration circuit is provided. The circuit includes: a differential amplifier having a non-inverting input terminal and an inverting input terminal; a first voltage divider network coupled between a pair of reference voltages and the non-inverting input terminal; a second voltage divider network coupled between the pair of reference voltages and the inverting input terminal. The first and second voltage divider networks produce the same voltage at the inverting and non-inverting input terminals.

In one embodiment, the first voltage divider network includes a pair of resistors, a first one of the pair of resistors, R1, being connected between a first one of the pair of reference voltages and the non-inverting input and a second one of the pair of resisters, R2, being connected between the non-inverting input and the second one of the pair of reference voltages.

In one embodiment, the second voltage divider network includes a pair of resistors, a first one of the pair of resistors, R3, being connected between a first one of the pair of reference voltages and the inverting input and a second one of the pair of resisters, R4, being connected between the inverting input and the second one of the pair of reference voltages.

In one embodiment, R1 is has the same resistance as R3 and R2 has the same resistance as resistor R4.

In one embodiment, a transmission line is coupled between a source of clock signals and the input terminals. The transmission line has a characteristic impedance Zo, and R1*R2(R1+R2) equals Zo.

In one embodiment, the source of clock pulses is an emitter coupled logic circuit and wherein the potential difference provided by the pair of reference voltages voltage, Vcc, times (R2/(R1+R2)) and Vcc, times (R3/R3+R4) are selected to provide predetermined proper terminating voltages to the emitter coupled logic circuit.

In one embodiment, the source of clock pulses is a transistor-transistor logic circuit having an output transistor, such output transistor having an emitter and collector coupled between the pair of reference potentials. A coupling resistor R5 is serially connected between the collector electrode and the non-inverting input though the transmission line, such resistor R5 being selected to provide a predetermined proper voltage swing across the non-inverting and inverting inputs The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
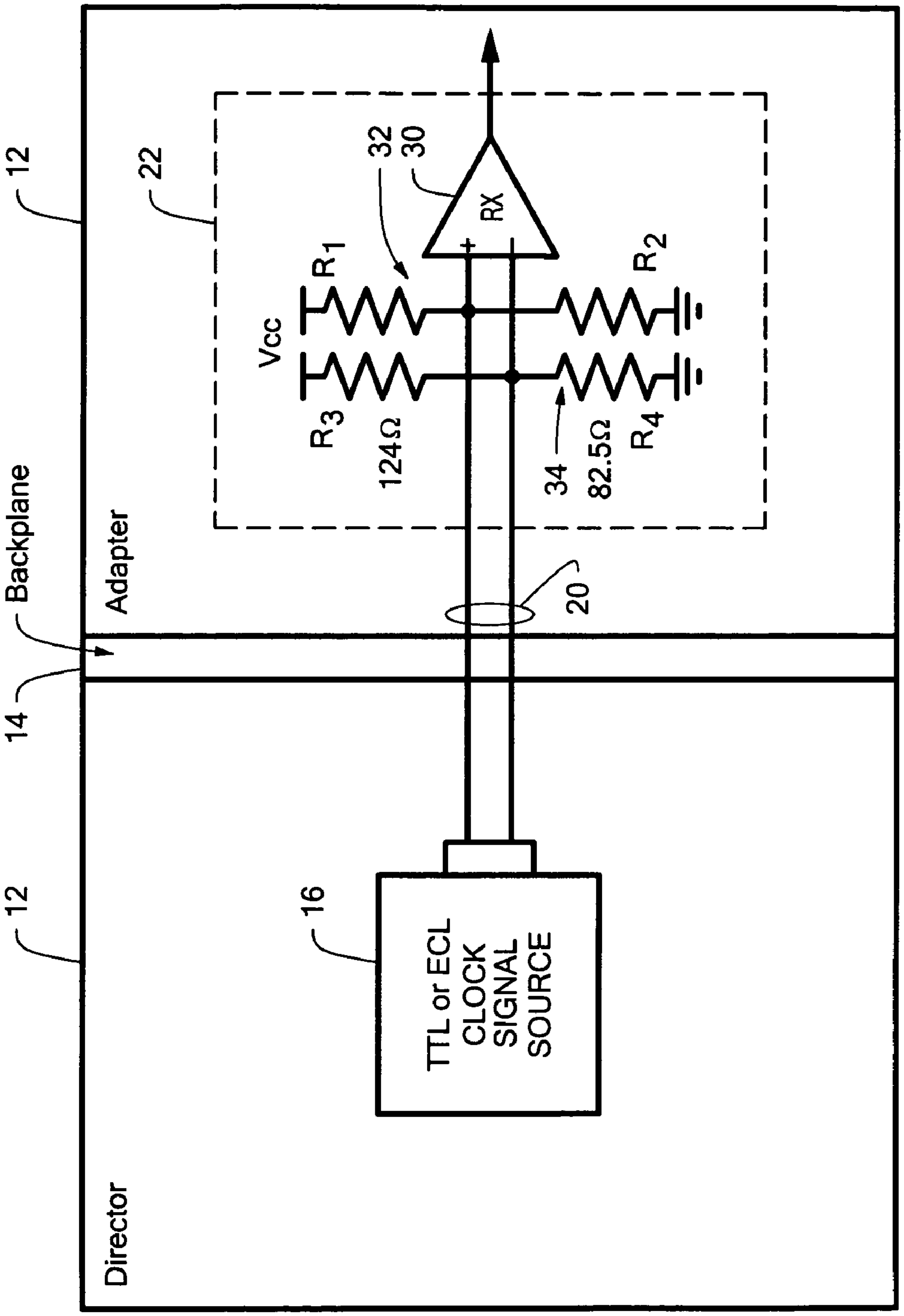
FIG. 1 is a block diagram of a source of clock pulse coupled to a clock pulse regeneration circuit according to the invention.

Referring now to FIG. 1 a director board 10 is shown coupled to an adapter board 12 through a backplane 14. The director board 10 includes a clock signal source 16 for producing clock pules, such clock piles being transmitted to the adapter 12 through a transmission line 20. The adapter board 12 includes a clock regeneration circuit section 22. The clock signal source may be include either a TTL logic circuit transmitter (i.e., for producing the single- ended clock pulses) or an ECL logic circuit transmitter, here a PECL logic circuit transmitter (i.e., for producing differential clock pulses). In either case, the clock regeneration circuit section 22, converts the clock signals produced by the clock signal source 16 (having either the single- ended clock pulses or the differential clock pulses) to clock signals having substantially the same voltage swing.

Figure 2:
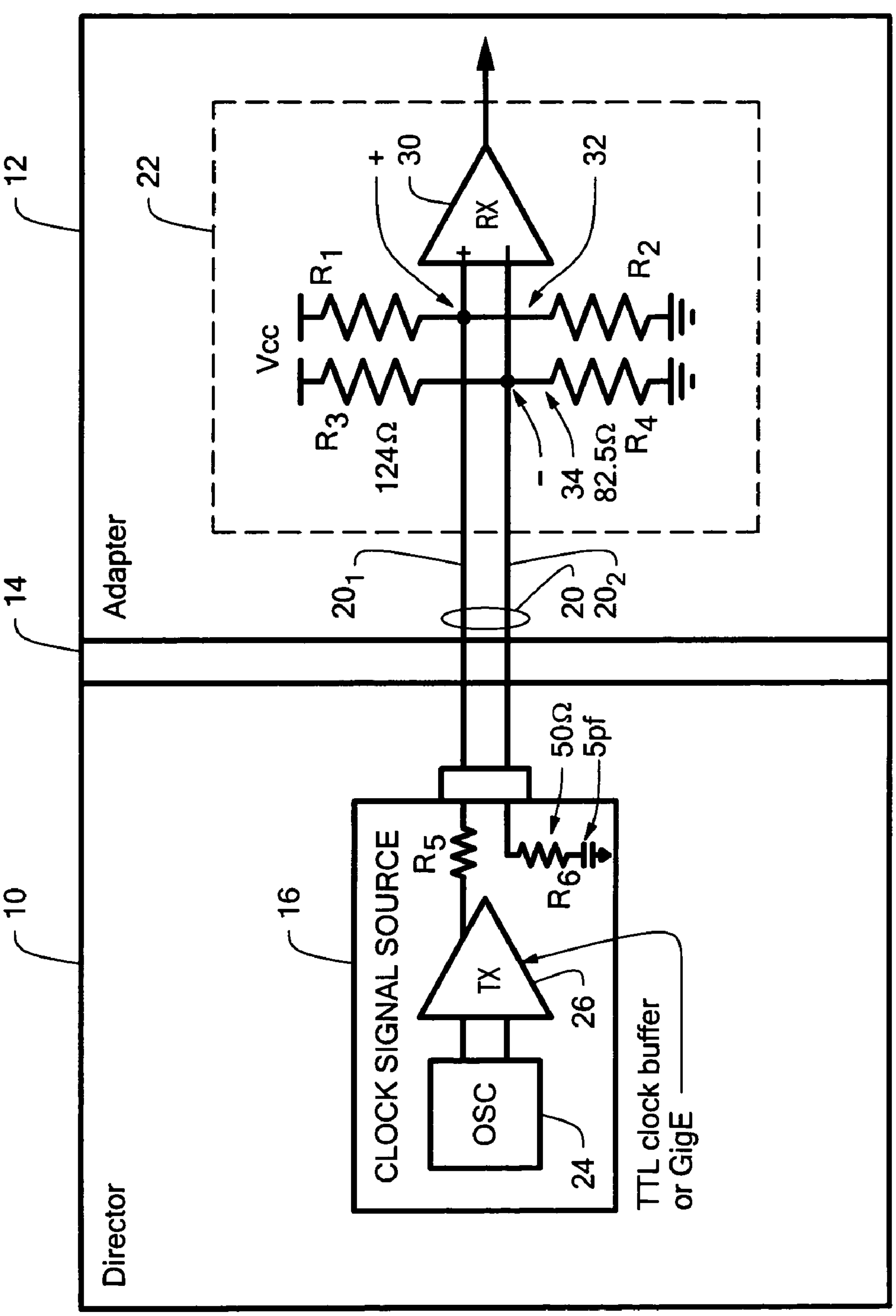
FIG. 2 is a block diagram of a source of single-ended clock pulses to the clock pulse regeneration circuit according to the invention.

Referring to FIG. 2, the clock signal source 16 in FIG. 1, includes an oscillator 24 coupled to a TTL logic circuit transmitter 26' (i.e., for producing the single-ended clock pulses) to provide a TTL clock signal source 16', as shown. The output section of the TTL logic circuit transmitter 26' is shown in more detail in FIG. 2 to include a grounded emitter transistor having a collector coupled to Vcc, here 3.3 volts through a pull up resistor RL. Thus, the output of the transmitter 26' produces a single ended train of clock pulses on line 20' of the transmission line 20.

Referring again to FIGS. 1 and 2, the adapted board 12, as noted above, includes a clock regeneration circuit section 22. The section 22 includes a differential amplifier 30 (or receiver) having a non-inverting input terminal (+) and an inverting input terminal (−). A first voltage divider network 32 is coupled between a pair of reference voltages, here +Vcc and ground, and the non-inverting input terminal (+). A second voltage divider network 34 is coupled between the pair of reference voltages, (i.e., +Vcc and ground) and the inverting input terminal (−). The first and second voltage divider networks 32, 34 produce the same voltage at the inverting (−) and non-inverting input terminals (+).

More particularly, the first voltage divider network 32 includes a pair of resistors, R1. R2. A first one of the pair of resistors, R1, is connected between a first one of the pair of reference voltages, here +Vcc, and the non-inverting input (+) and a second one of the pair of resisters, R2, is connected between the non-inverting input (+) and the second one of the pair of reference voltages, here ground.

The second voltage divider network 34 includes a pair of resistors, R3, R4. A first one of the pair of resistors, R3, is connected between a first one of the pair of reference voltages, here +Vcc, and the inverting input (−) and a second one of the pair of resisters, R4, is connected between the inverting input (−) and the second one of the pair of reference voltages, here ground.

The resistor R1 has the same resistance as R3 and R2 has the same resistance as resistor R4. Here, in this example, R1=R3=124 ohms and R2=R4=82.5 ohms It is noted that the transmission line 20 is used to couple the source of clock signals 16 (FIG. 1) and the input terminals (+), (−). The transmission line 20 has a characteristic impedance Zo, here 50 ohms. It is noted that the transmission line 20 is terminated in this characteristic impedance, Zo. Thus, R1*R2/(R1+R2)=R3*R4/(R3+R4)=Zo.

Figure 3:
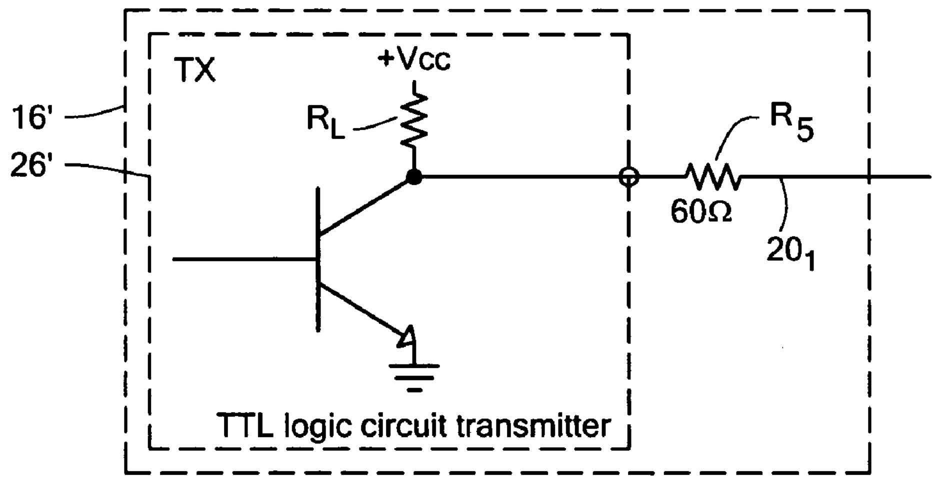
FIG. 3 is a schematic diagram of an output portion of a TTL logic circuit used in the source of single-ended clock pulse of FIG. 2.
Figure 4A:
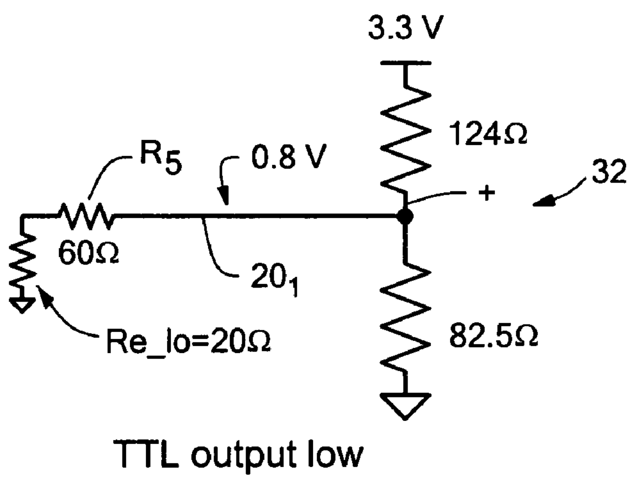
FIG. 4A is an equivalent circuit of the source of single-ended clock pulse of FIG. 2 when a transistor used in the output portion is conducting.
Figure 4B:
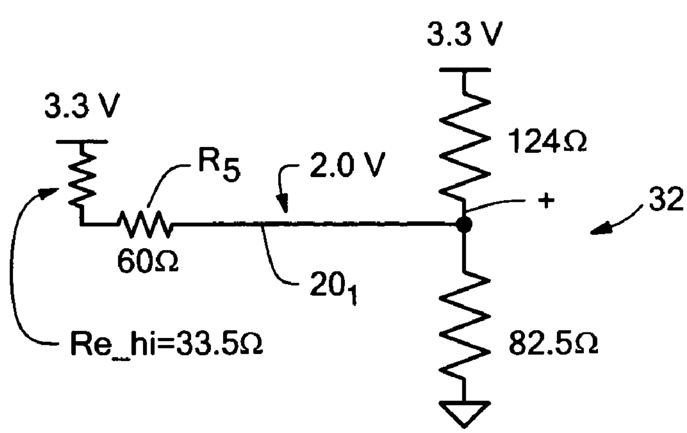
FIG. 4B is an equivalent circuit of the source of single-ended clock pulse of FIG. 2 when a transistor used in the output portion is non-conducting.

Referring now to FIGS. 4A and 4B, FIG. 4A shows an equivalent circuit for the transistor in the output section of the TTL logic circuit transmitter 26', shown in FIG. 3, when such transistor is conducting, here represented by a resistor Re_lo here 20 ohms, and FIG. 4B shows an equivalent circuit for the transistor, with pull-up resistor RL, when such transistor is non-conducting, here represented by a resistor Re_ho here 33.5 ohms. It is also noted in FIGS. 2 and 3 that the clock signal source 16' includes a coupling resistor R5 serially connected between the collector electrode and the non-inverting input (+) though the line $\mathbf{20}_1$ of transmission line 20. The resistor R5 is included in the equivalent circuits shown in FIGS. 4A and 4B. As noted above, line 20, is connected to the non-inverting input (+) and to the first voltage divider network 32.

Figure 5:
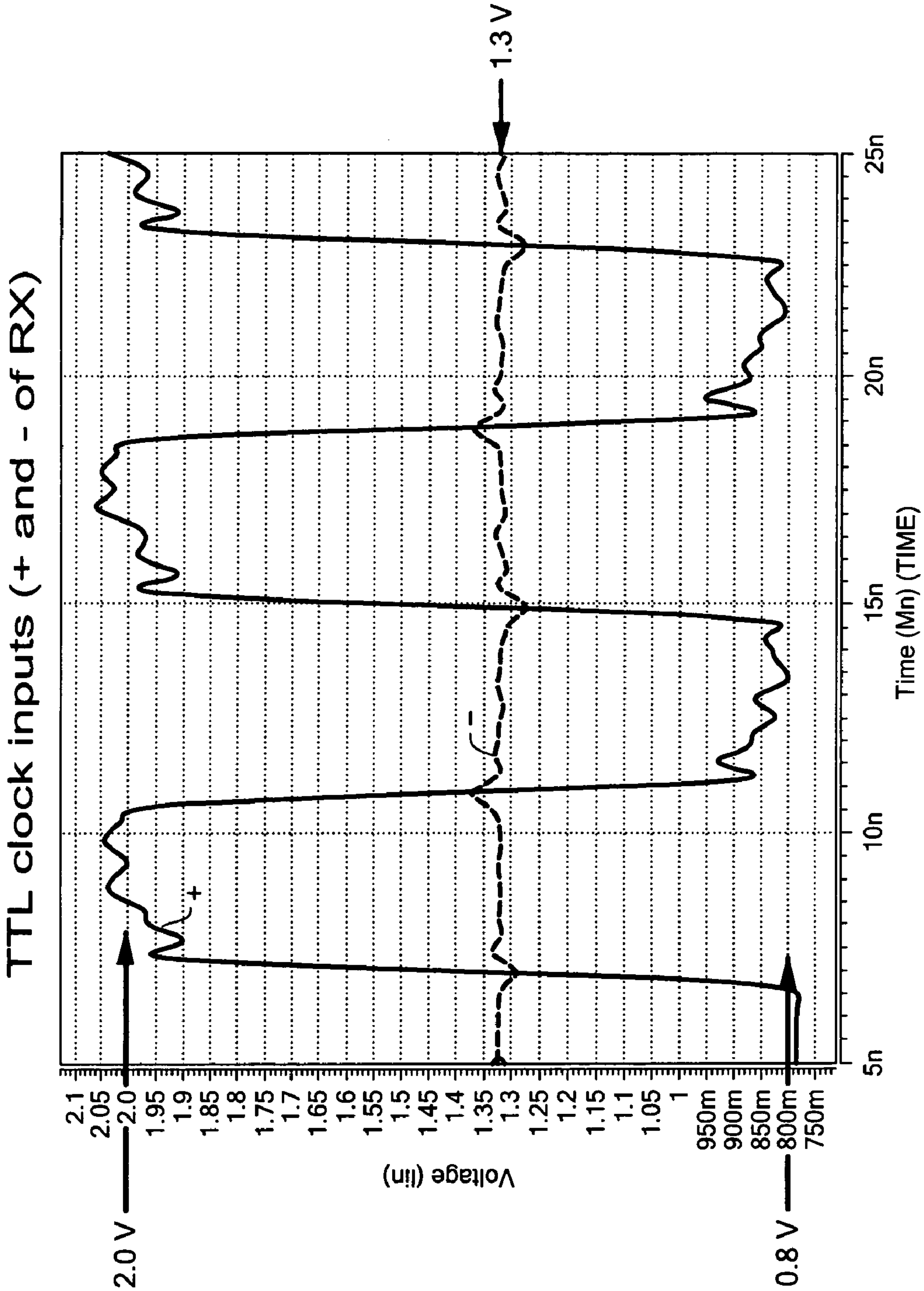
FIG. 5 are curves showing voltages produced by the TTL logic circuit of FIG. 3.
Figure 6:
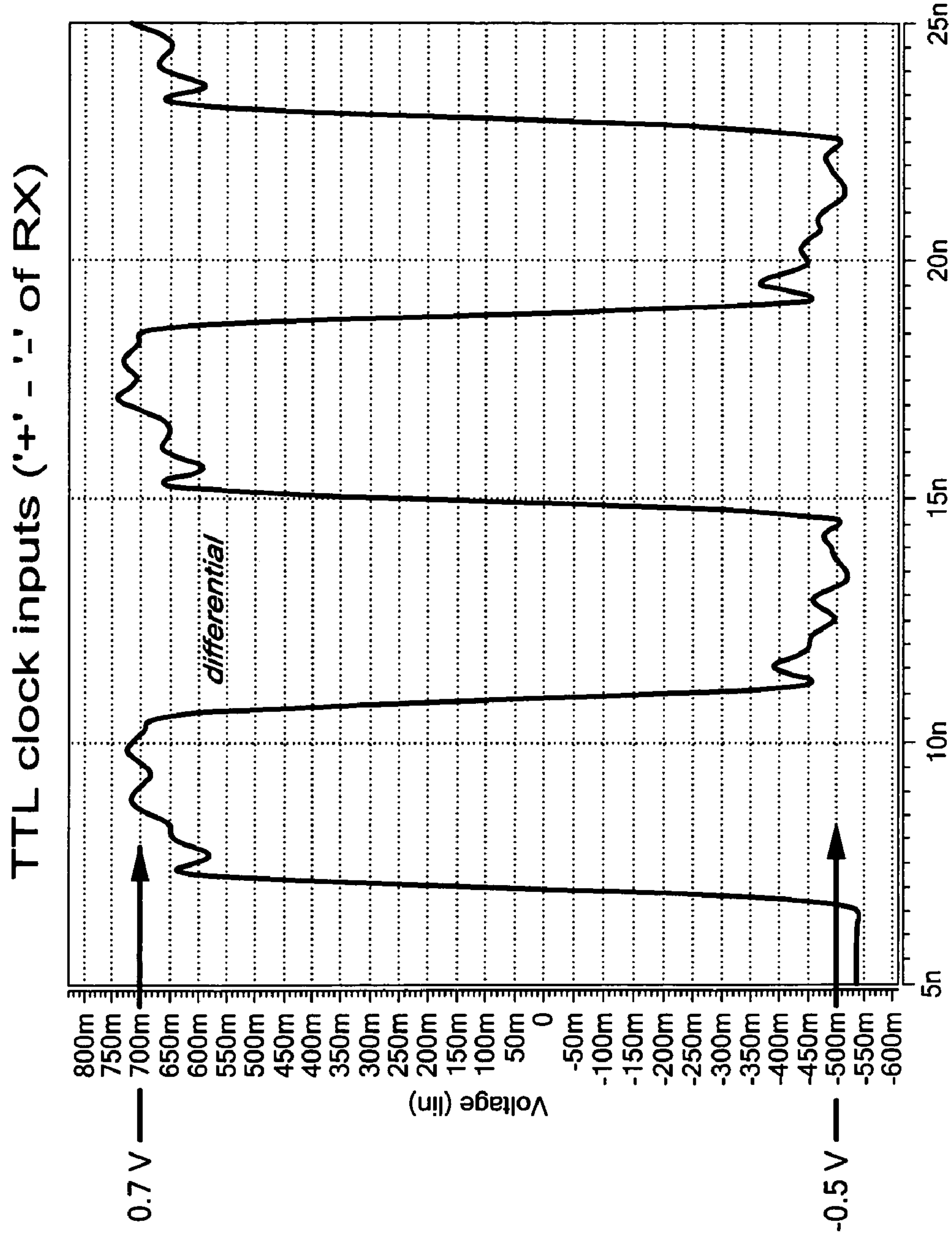
FIG. 6 is a curve showing the clock pulses produced by the a clock pulse regeneration circuit of FIG. 2.

Referring to FIG. 2, line $\mathbf{20}_2$ of the transmission line is connected to ground through a dc blocking capacitor, here 5 pf, and serially connected resistor R6, here 50 ohms. The resistor R6 is selected to match the characteristic impedance of the transmission line 20, Thus, as also noted above, and referring to FIG. 2, the inverting input terminal (–) is connected to the second voltage divider network 34. The resistor R5 is selected to provide a predetermined proper voltage swing across the non-inverting and inverting inputs. Thus, here resistor R5 is 60 ohms. Thus, when the transistor is conducting, FIG. 4A, the voltage on line $\mathbf{20}_1$ is 0.8 volts and when non-conducting, FIG. 4B, the voltage on line $\mathbf{20}_1$ is here 2.0 volts. The second resistor divider network 34, FIG. 2 produces a voltage of 1.3 volts on line $\mathbf{20}_2$. Thus, as shown in FIG. 5, the voltage on line $\mathbf{20}_1$ (i.e., at the non-inverting input (+) swings between about 2.0 volts and 0.8 volts while the voltage on line $\mathbf{20}_2$ remains substantially at 1.3 volts. In response to the voltages shown in FIG. 5, the clock pulse regeneration circuit section 32, FIG. 2, produces clock pulses shown in FIG. 6, such clock pulses having a voltage swing between about +0.7 volts and –0.5 volts.

Figure 7:
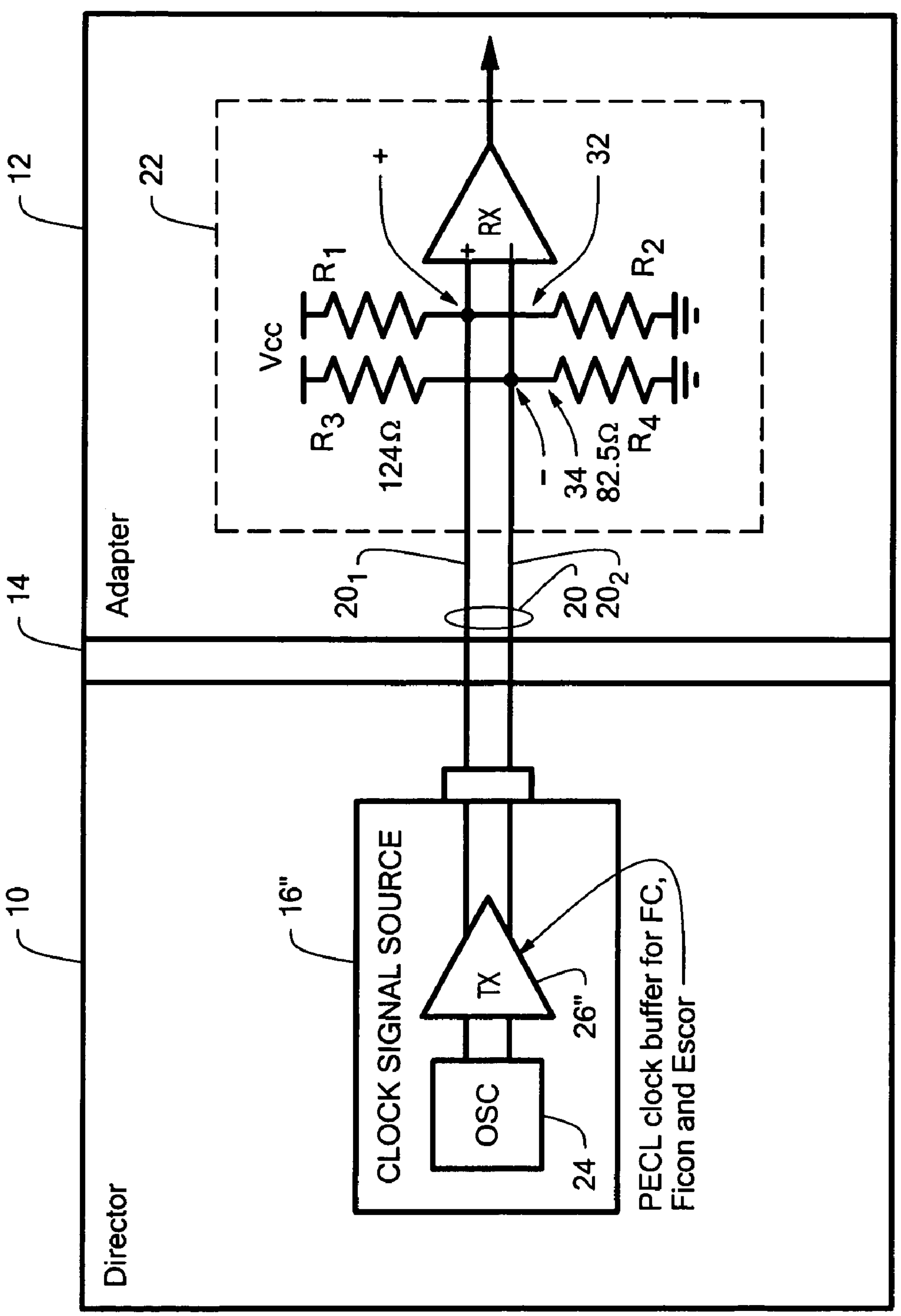
FIG. 7 is a block diagram of a source of differential clock pulses coupled to the clock pulse regeneration circuit according to the invention.

Referring now to FIG. 7, the TTL logic circuit transmitter 26' (i.e., for producing the single- ended clock pulses) is replaced with an ECL logic circuit transmitter 26", here a PECL logic circuit. The potential difference provided by the pair of reference voltages voltage, Vcc, times (R2/(R1+R2)) and Vcc, times (R3/R3+R4) are selected to provide predetermined proper terminating voltages to the emitter coupled logic circuit. Thus, here the resistors R1 and R2 are selected to provide +1.3 volt on line $\mathbf{20}_1$ (i.e., at the non-inverting input (+)) and the resistors R3 and R4 are selected to provide +1.3 volt on line $\mathbf{20}_2$ (i.e., at the inverting input (–)). As noted above, in order to match load terminate the transmission line 20, R1*R2/(R1+R2)=R3*R4/(R3+R4)=Zo =50. Therefore, to satisfy these relationships, R1=R3=124 ohms and R2=R4=82.5 ohm. It is noted that these values for R1, R3, R2 and R4 were used in connection with the TTL transmitter 16' described above in connection with FIGS. 2, 3, 4A and 4B. Thus, the same clock regeneration circuit section 22 is used for either the TTL logic circuit transmitter 26' (i.e., for producing the single- ended clock pulses) is replaced with an ECL logic circuit transmitter 26" (i.e., for producing differential clock pulses).

Figure 8:
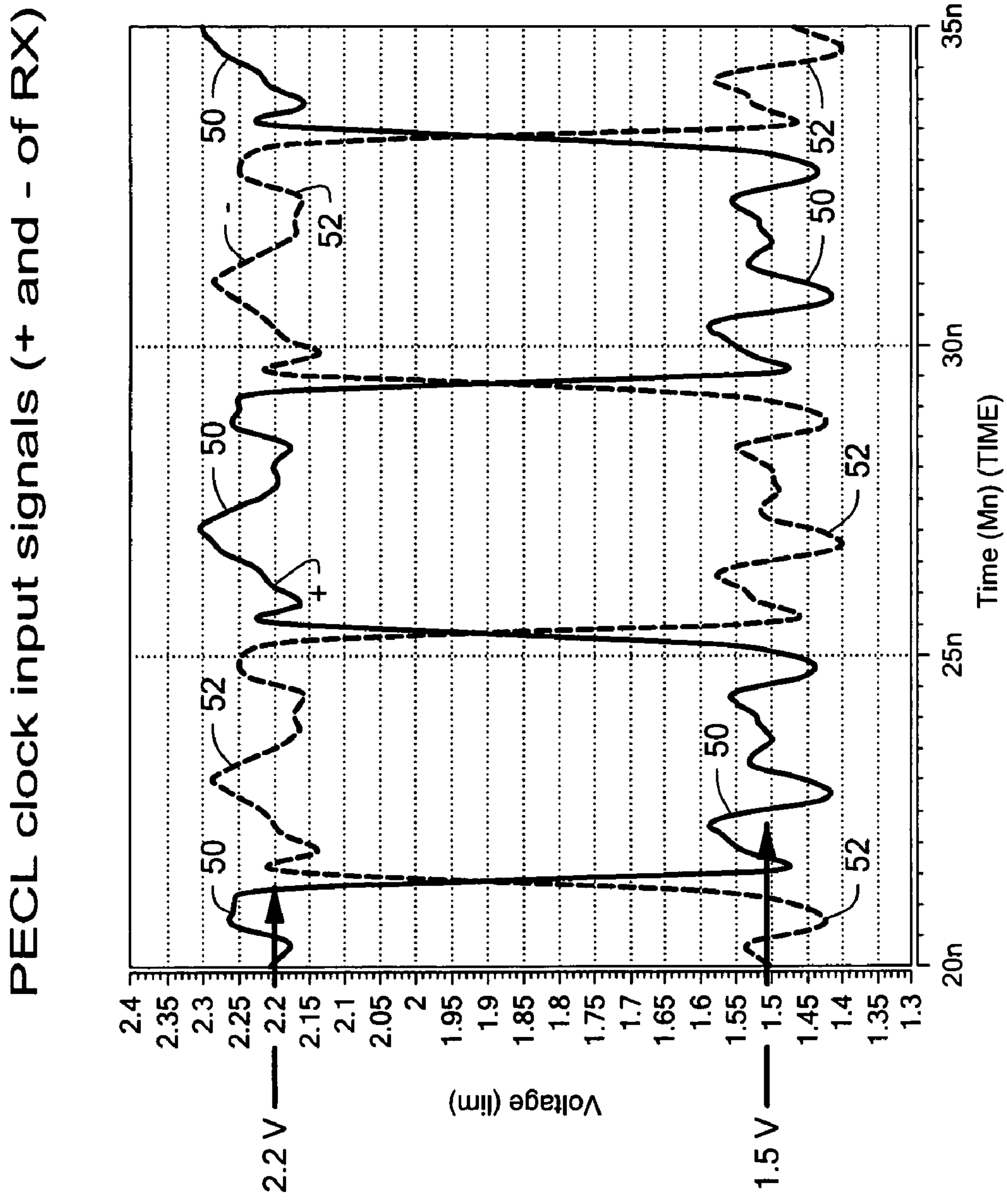
FIG. 8 are curves showing voltages produced by the source of differential clock pulses of FIG. 7.

Referring now to FIG. 8, the voltage swing on line $\mathbf{20}_1$ (i.e., at the non-inverting input (+)) relative to ground is shown in the curve labeled 50 in FIG. 8. It is noted that the voltage swing is between about +2.2 volts and +1.5 volts. The voltage swing on line $\mathbf{20}_2$ (i.e., at the inverting input (–)) relative to ground is shown in the curve labeled 52 in FIG. 8. It is noted that the voltage swing is also between about +2.2 volts and +1.5 volts.

Figure 9:
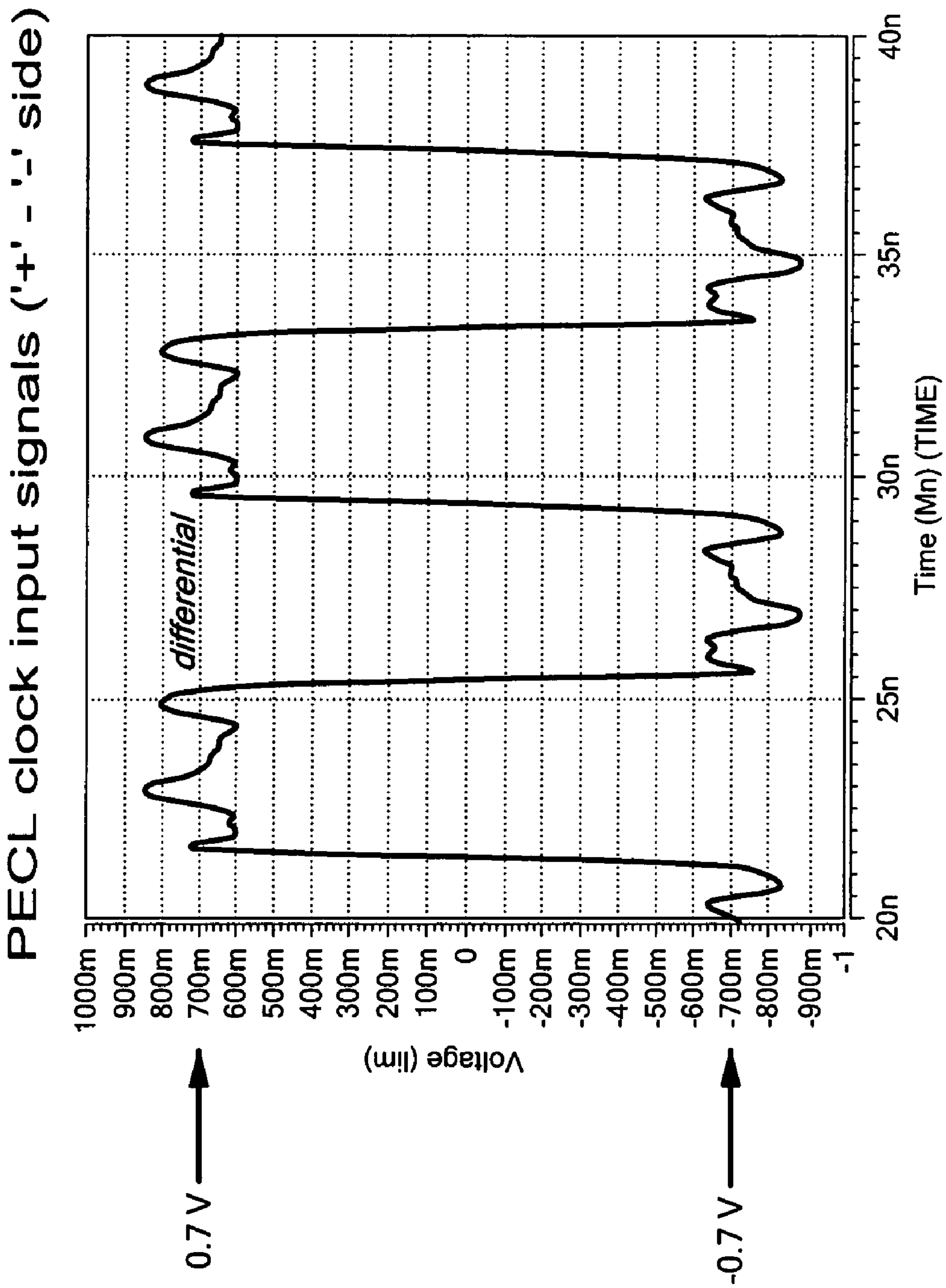
FIG. 9 is a curve showing the clock pulses produced by the a clock pulse regeneration circuit of FIG. 8.

In response to the voltages shown in FIG. 8, the clock pulse regeneration circuit section 32, FIGS. 2 and 7, produces clock pulses shown in FIG. 9, such clock pulses having a voltage swing between about +0.7 volts and –0.7 volts. Thus, the voltage swing is substantially the same as the voltage swing shown in FIG. 6. Thus, the clock pulse regeneration circuit section 32, FIGS. 2 and 7, converts clock signals having either the single-ended clock pulses (i.e., from TTL logic circuit transmitter 26' ) or the differential clock pulses to clock signals (i.e., from ECL logic circuit transmitter 26") to clock pulses having substantially the same voltage swing.

A number of embodiments of the invention have been described. Nevertheless, it will be understood that various modifications may be made without departing from the spirit and scope, of the invention. Accordingly, other embodiments are within the scope of the following claims.

What is claimed is:

1. A clock regeneration circuit, comprising:

a differential amplifier having a non-inverting input terminal and an inverting input terminal;

a first voltage divider network coupled between a pair of reference voltages and the non-inverting input terminal;

a second voltage divider network coupled between the pair of reference voltages and the inverting input terminal;

a first resistor serially connected between a source of clock pulses and first one of the input terminals of the differential amplifier; and a second resistor connected between a second one of the input terminals of the differential amplifier and one of the pair of reference voltages;

wherein the first and second voltage divider networks produce the same differential voltage swing for both single-ended or differential clock source voltages at the inverting and non-inverting input terminals.

2. The clock regeneration circuit recited in claim 1 wherein the first voltage divider network includes a pair of resistors, a first one of the pair of resistors, R1, being connected between a first one of the pair of reference voltages and the non-inverting input and a second one of the pair of resisters, R2, being connected between the non-inverting input and the second one of the pair of reference voltages.

3. The clock regeneration circuit recited in claim 2 wherein the second voltage divider network includes a pair of resistors, a first one of the pair of resistors, R3, being connected between a first one of the pair of reference voltages and the inverting input and a second one of the pair of resisters, R4, being connected between the inverting input and the second one of the pair of reference voltages.

4. The clock regeneration circuit recited in claim 3 wherein R1 is has the same resistance as R3 and R2 has the same resistance as resistor R4.

5. A clock regeneration circuit, comprising:

a differential amplifier having a non-inverting input terminal and an inverting input terminal;

a first voltage divider network coupled between a pair of reference voltages and the non-inverting input terminal, the first voltage divider network having a pair or resistors, a first one of the pair resistors, R1, being connected between a first one of the pair of reference voltages and the non-inverting input and a second one of the pair of resistors, R2, being connected between the non-inverting input and a second one of the pair of reference voltages;

a second voltage divider network coupled between the pair of reference voltages and the inverting input terminal;

wherein the first and second voltage divider networks produce the same voltage at the inverting and non-inverting input terminals a transmission line coupled between a source of clock signals and the input terminals, and wherein such transmission line has a characteristic impedance Zo, and wherein R1*R2/(R1+R2) equals Zo; and wherein the source of clock pulses is a transistor-transistor logic circuit having an output transistor, such output transistor having an emitter and collector coupled between the pair of reference potentials, and including a coupling resistor R5 serially connected between the collector electrode and the non-inverting input though the transmission line, such resistor R5 being selected to provide a predetermined proper voltage swing across the non-inverting and inverting inputs.

6. The clock regeneration circuit recited in claim 5 wherein the second voltage divider network includes a pair of resistors, a first one of the pair of resistors, R3, being connected between a first one of the pair of reference voltages and the inverting input and a second one of the pair of resisters, R4, being connected between the inverting input and the second one of the pair of reference voltages.

7. The clock regeneration circuit recited in claim 6 wherein the source of clock pulses is an emitter coupled logic circuit and wherein the potential difference provided by the pair of reference voltages voltage, Vcc, times (R2/(R1+R2)) and Vcc, times (R3/(R3+R4)) are selected to provide predetermined proper terminating voltages to the emitter coupled logic circuit.

8. A method for regenerating clock signals, comprising:

providing a source of clock signals, such source having either TTL logic circuit for producing single- ended lock pulses or ECL logic circuit for producing differential clock pulses, providing a clock pulse regeneration circuit;

feeding to clock signals to the regeneration circuit, such regeneration circuit converting such clock signals having either the single ended clock pulses or the differential clock pulses into clock signals having substantially the same voltage swing; providing such regeneration circuit with;

a differential amplifier having a non-inverting input terminal and an inverting input terminal;

a first voltage divider network coupled between a pair of reference voltages and the non-inverting input terminal;

a second voltage divider network coupled between the pair of reference voltages and the inverting input terminal;

wherein the first and second voltage divider networks produce the same voltage at the inverting and non-inverting input terminals and including a first resistor serially connected between a source of clock pulses and one of the input terminals of the differential amplifier; and a second resistor connected between a second one of the input terminals of the differential amplifier and one of the pair of reference voltages.

9. The method recited in claim 8 wherein the first voltage divider network is provided with a pair of resistors, a first one of the pair of resistors, R1, being connected between a first one of the pair of reference voltages and the non-inverting input and a second one of the pair of resisters, R2, being connected between the non-inverting input and the second one of the pair of reference voltages.

10. The method recited in claim 9 wherein the second voltage divider network is provided with a pair of resistors, a first one of the pair of resistors, R3, being connected between a first one of the pair of reference voltages and the inverting input and a second one of the pair of resisters, R4, being connected between the inverting input and the second one of the pair of reference voltages.

11. The method recited in claim 10 wherein R1 is has the same resistance as R3 and R2 has the same resistance as resistor R4.

12. The method recited in claim 11 including providing a transmission line coupled between a source of clock signals and the input terminals, and wherein such transmission line has a characteristic impedance Zo, and wherein R1*R2/(R1+R2) equals Zo.

13. A method for regenerating clock signals, comprising:

providing a source of clock signals, such source having either ITL logic circuit for producing single- ended lock pulses or ECL logic circuit for Producing differential clock pulses.

providing a clock pulse regeneration circuit;

feeding to clock signals to the regeneration circuit, such regeneration circuit converting such clock signals having either the single-ended clock pulses or the differential clock pulses into clock signals having substantially the same voltage swing;

providing such regeneration circuit with;

a differential amplifier having a non-inverting input terminal and an inverting input terminal;

a first voltage divider network coupled between a pair of reference voltages and the non-inverting input terminal;

a second voltage divider network coupled between the pair of reference voltages and the inverting input terminal; wherein the first and second voltage divider networks produce the same voltage at the inverting and non-inverting input terminals;

wherein the first voltage divider network is provided with a pair of resistors, a first one of the pair of resistors, R1, being connected between a first one of the pair of reference voltages and the non-inverting input and a second one of the pair of resisters R2, being connected between the non-inverting input and the second one of the pair of reference voltages;

wherein the second voltage divider network is provided with a pair of resistors a first one of the pair of resistors R3, being connected between a first one of the pair of reference voltages and the inverting input and a second one of the pair of resisters, R4, being connected between the inverting input and the second one of the pair of reference voltages;

wherein R1 is has the same resistance as R3 and R2 has the same resistance as resistor R4;

including providing a transmission line coupled between a source of clock signals and the input terminals, and wherein such transmission line has a characteristic impedance Zo, and wherein R1*R2(l+R2) equals Zo; and including connecting to the transmission line either;

an emitter coupled logic circuit for producing the clock pulses and wherein the potential difference provided by the pair of reference voltages voltage, Vcc, times (R2/(R1+R2)) and Vcc, times (R3/(R3+R4)) are selected to provide predetermined proper terminating voltages to the emitter coupled logic circuit; or an transistor-transistor logic circuit for producing the clock pulses having an output transistor, such output transistor having an emitter and collector coupled between the pair of reference potentials, and including a coupling resistor RS serially connected between the collector electrode and the non-inverting input though the transmission line, such resistor RS being selected to provide a predetermined proper voltage swing across the non-inverting and inverting inputs

14. The clock regeneration circuit recited in claim 6 wherein R1 is has the same resistance as R3 and R2 has the same resistance as resistor R4.

* * * * *